United States Patent
Seng et al.

(10) Patent No.: US 7,571,395 B1
(45) Date of Patent: Aug. 4, 2009

(54) GENERATION OF A CIRCUIT DESIGN FROM A COMMAND LANGUAGE SPECIFICATION OF BLOCKS IN MATRIX FORM

(75) Inventors: Shay Ping Seng, San Jose, CA (US); Arvind Sundararajan, Palo Alto, CA (US)

(73) Assignee: Xilinx, Inc., San Jose, CA (US)

( * ) Notice: Subject to any disclaimer, the term of this patent is extended or adjusted under 35 U.S.C. 154(b) by 226 days.

(21) Appl. No.: 11/196,174

(22) Filed: Aug. 3, 2005

(51) Int. Cl.
*G06F 17/50* (2006.01)

(52) U.S. Cl. .............................. 716/1; 716/16; 716/17; 326/38; 326/39; 326/41

(58) Field of Classification Search ..................... 716/8, 716/9, 16, 1, 17; 326/38, 39, 41
See application file for complete search history.

(56) References Cited

U.S. PATENT DOCUMENTS

| | | | | |
|---|---|---|---|---|
| 5,089,973 A | * | 2/1992 | Furtek ........................... | 716/17 |
| 5,128,871 A | * | 7/1992 | Schmitz ........................ | 716/17 |
| 5,313,615 A | * | 5/1994 | Newman et al. .............. | 716/11 |
| 5,894,565 A | * | 4/1999 | Furtek et al. ................... | 326/38 |
| 5,946,219 A | * | 8/1999 | Mason et al. ................. | 716/16 |
| 6,014,509 A | * | 1/2000 | Furtek et al. ................... | 716/16 |
| 6,026,227 A | * | 2/2000 | Furtek et al. ................... | 716/16 |
| 6,167,559 A | * | 12/2000 | Furtek et al. ................... | 716/16 |
| 6,457,164 B1 | * | 9/2002 | Hwang et al. .................. | 716/8 |
| 6,519,756 B1 | * | 2/2003 | Kao et al. ...................... | 716/18 |
| 6,817,006 B1 | * | 11/2004 | Wells et al. .................... | 716/16 |
| 6,891,395 B2 | * | 5/2005 | Wells et al. .................... | 326/38 |
| 2006/0085781 A1 | * | 4/2006 | Rapp et al. ..................... | 716/17 |

OTHER PUBLICATIONS

Sharp, R. et al.; "An Introduction to Ruby"; 2nd Edition; Oct. 1995; Department of Computer Science, Technical University of Denmark; available from http://citeseer.ist.psu.edu/cache/papers/cs/12044/ftp:zSzzSzftp.it.dtu.dkzSzpubzSzRubyzSzintro.pdf/sharp95introduction.pdf; pp. 1-115.

* cited by examiner

*Primary Examiner*—Paul Dinh
*Assistant Examiner*—Patrick Sandoval
(74) *Attorney, Agent, or Firm*—LeRoy D. Maunu; Kim Kanzaki; Lois D. Cartier

(57) ABSTRACT

Generation of a circuit design using a command language. The various approaches include generating in a memory arrangement respective instances of design blocks in response to user-entered commands that specify creation of the instances. Matrix-relative positions of the instances of design blocks are established in the memory arrangement in response to at least one user-entered command that specifies respective matrix positions of the instances. Representative connections between the instances are generated in the memory arrangement in response to a user-entered command having no specification of the connections.

19 Claims, 10 Drawing Sheets

GENERATION OF A CIRCUIT DESIGN FROM A COMMAND LANGUAGE SPECIFICATION OF BLOCKS IN MATRIX FORM

FIELD OF THE INVENTION

The present invention generally relates to circuit design tools.

BACKGROUND

Electronic circuits are often designed using hardware description languages (HDLs) such as VHDL and Verilog. While very powerful, these languages may obscure understanding of the algorithm to be implemented in hardware.

High-level modeling systems (HLMSs), such as the System Generator HLMS from Xilinx, provide an interface and approach for abstractly specifying a circuit design. Complex circuits may be specified by drawing a network of connected blocks via a graphical user interface (GUI). In the System Generator HLMS, a circuit may be modeled as a system of polymorphic blocks connected by wires that carry signals of application-dependent types. This visual approach is convenient for designing, debugging, and testing a design, as well as for generating a hardware realization of the design.

For added flexibility, the Simulink tool from The MathWorks, Inc., in which the System Generator HLMS operates, enables programmatic creation of block diagrams by way of a command language for adding blocks and connecting ports between blocks. However, this command interface may be tedious and error prone because the user is required to explicitly specify connectivity and sometimes specify placement of the blocks. Furthermore, parameterizing the blocks created with the command language may be difficult.

The present invention may address one or more of the above issues.

SUMMARY OF THE INVENTION

The various embodiments of the invention provide generation of a circuit design using a command language. In one embodiment, respective instances of design blocks are generated in a memory arrangement in response to user-entered commands that specify creation of the instances. Matrix-relative positions of the instances of design blocks are established in the memory arrangement in response to at least one user-entered command that specifies respective matrix positions of the instances. Representative connections between the instances are generated in the memory arrangement in response to a user-entered command having no specification of the connections.

In another embodiment, an apparatus is provided for generating a circuit design. The apparatus includes means for generating in a memory arrangement respective instances of design blocks responsive to user-entered commands that specify creation of the instances; means for establishing in the memory arrangement matrix-relative positions of the instances of design blocks responsive to at least one user-entered command that specifies respective matrix positions of the instances; and means for generating in the memory arrangement representative connections between the instances responsive to a user-entered command having no specification of the connections.

A system for generating a circuit design is provided in another embodiment. The system includes a computing arrangement and a memory arrangement coupled to the computing arrangement. A command processor is hosted by the computing arrangement and is configured to receive user input commands. In response to the commands, the command processor generates in the memory arrangement respective instances of design blocks for commands that specify creation of the instances. Further in response to the commands, the command processor establishes in the memory arrangement matrix-relative positions of the instances of design blocks for commands that specify respective matrix positions of the instances. The command processor generates in the memory arrangement representative connections between the instances for a command having no specification of the connections.

It will be appreciated that various other embodiments are set forth in the Detailed Description and Claims which follow.

BRIEF DESCRIPTION OF THE DRAWINGS

Various aspects and advantages of the invention will become apparent upon review of the following detailed description and upon reference to the drawings in which:

FIG. 11 shows the orientation of blocks within an xblk when xblk w is rendered as a subsystem of xblk a;

DETAILED DESCRIPTION

The block construction language and data structures used to represent circuitry defined via the language permits reorganization of the elements to form functionally equivalent but structurally different circuits.

Figure 1:
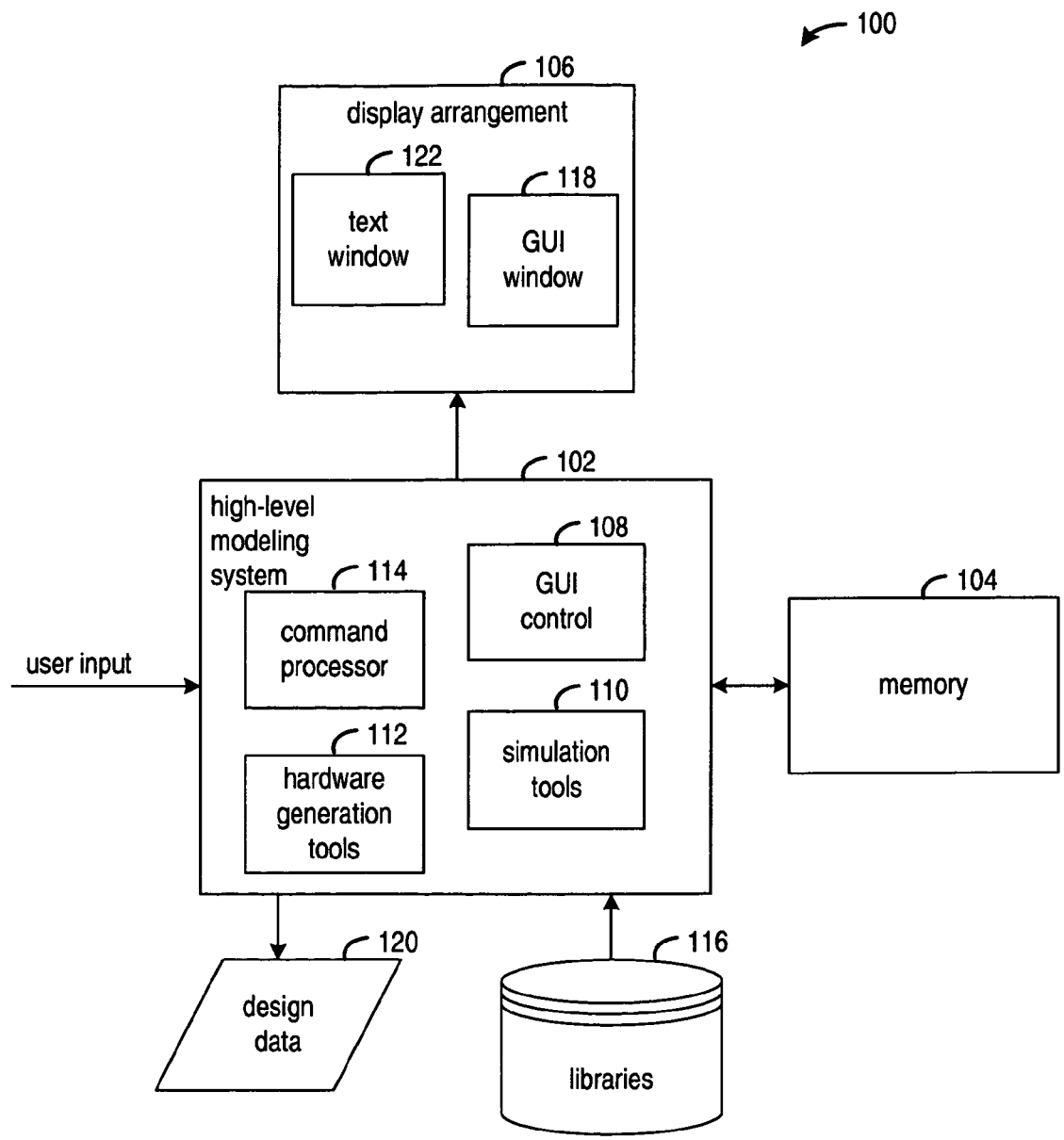
FIG. 1 is a functional block diagram of an example arrangement for preparing a circuit design in accordance with various embodiments of the invention.

FIG. 1 is a functional block diagram of an example arrangement 100 for preparing a circuit design in accordance with various embodiments of the invention. The arrangement generally includes a high-level modeling system (HLMS) 102, which executes on a processor arrangement (not shown), a memory 104, and a display arrangement 106. Those skilled in the art will appreciate that various types of computing arrangements, for example, standalone or networked workstations, may be suitable for hosting an HLMS.

The HLMS includes a GUI control 108, simulation tools 110, hardware generation tools 112, and a command processor 114. The GUI control provides the user with functions for creating a design via an interface having selectable icons that represent various components and functions that may be used to build a design. The various components may be selected from a library 116 that accompanies the HLMS, and the selected items and connections are displayed by the GUI control in GUI window 118.

The HLMS may also provide a simulation tool 110 for simulating behavior of the design. The test bench used in simulation may also be created using the GUI control 108 and components from library 116, and simulation results provided in GUI window 118.

The hardware implementation tools 112 take the high-level design created with the GUI control 108 and translate the design into a form from which a hardware circuit may be realized. For example, the hardware implementation tools provide functions such as logic synthesis, technology mapping, and placing and routing of the design. The form of the output, which is shown as design data 120, depends on the target hardware technology.

The command processor 114 receives commands input from a user for adding blocks to a design. It will be appreciated that commands may be entered interactively or provided as input via a script file. The language of the commands allows the user to construct a design without having to explicitly specify connections between blocks. For notational convenience, the language is called the block construction language in this document. In the block construction language blocks are composed into 2-dimensional matrices. Each block within a matrix may itself be a composition of blocks, allowing for a nested hierarchy of blocks to be created. In an example embodiment, the mathematical operations on matrices as provided by the Matlab command language (from The Mathworks) have been overloaded to affect structural changes on a matrix of design blocks. In the example embodiment, the syntax of the block construction language is similar to the Matlab command language.

The block construction language has a number of features. One feature is that the connectivity of a block (or system) is only determined at the time of rendering (not during construction or assembly of a block). This relieves the user from the burden of having to explicitly specify connections between blocks. Generally, the blocks are connected during the rendering process by connecting ports in adjacent rows or columns. An additional feature of the language is that the matrix syntax may be used to specify rows and columns of blocks. For example, [a, b, c] creates an object with the three blocks a, b, c placed in a row, and [d; e; f] creates an object with blocks d, e, f placed in a column.

It will be appreciated that GUI control 108, simulation tools 110, hardware generation tools 112, and command processor 114 use memory 104 for storing design data generated by the respective functions. In regards to the command processor, the data that represents the objects created, organized, and rendered as a result of user input commands is stored in memory 104. Those skilled in the art will recognize many alternative data structures may be suitable for managing the data generated by the command processor.

Figure 2:
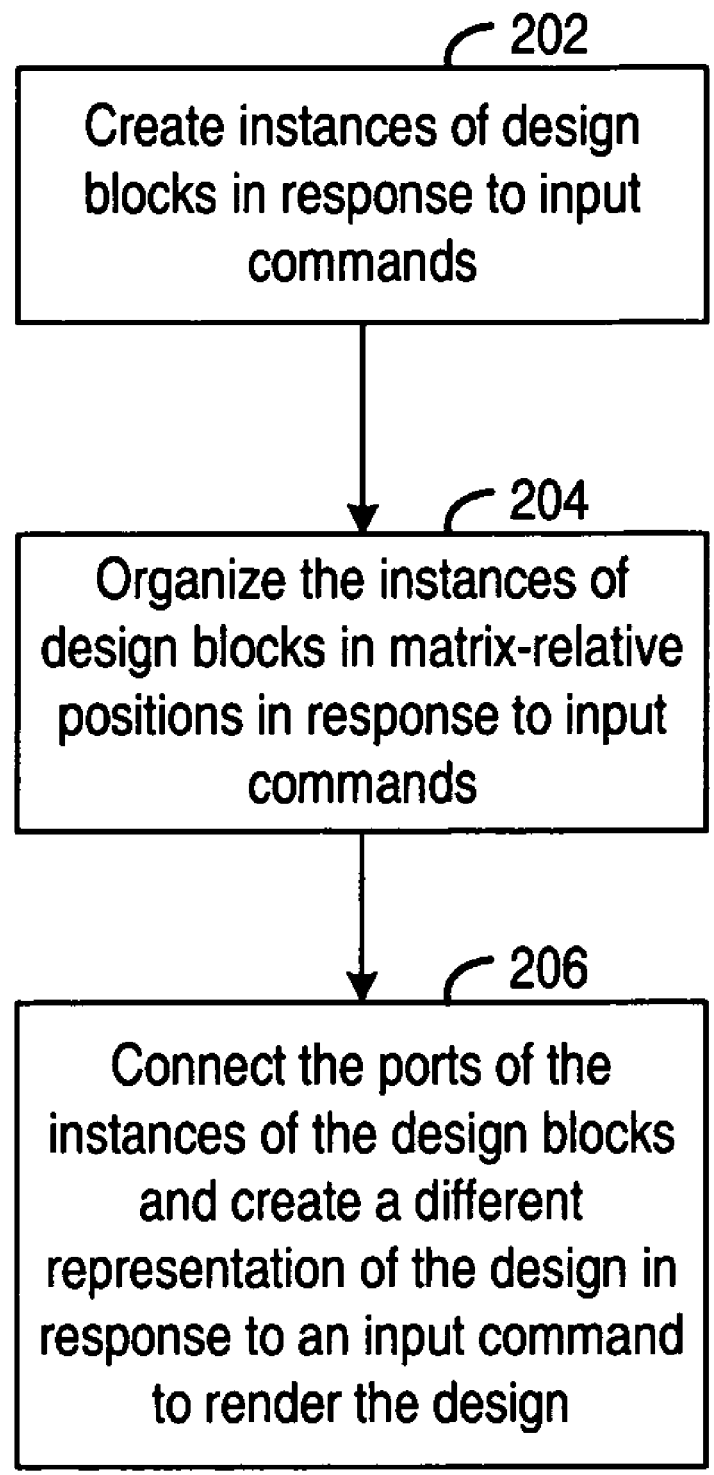
FIG. 2 is a flowchart of an example process for preparing a design using the block construction language in accordance with various embodiments of the invention.

FIG. 2 is a flowchart of an example process for preparing a design using the block construction language in accordance with various embodiments of the invention. While not shown as a separate step in FIG. 2, it will be appreciated that the block construction language may be used to supplement a design created via a GUI-based tool. In using the block construction language, instances of design blocks are created in response to user input of commands that specify creation of the block instances (step 202).

Further input commands are used to organize the instances of the blocks into matrix-relative positions (step 204). For example, in the example embodiment matrix operators are used to specify row and column positions of block instances. From the matrix positions connections may be automatically determined between the blocks.

Once the instances of the blocks have been created and organized, the instances of the blocks may be rendered into a desired design format. The rendering of the block instances determines those ports of block instances in adjacent rows and columns that are to be connected. Once the connections are determined, the block instances and connections may be rendered into a desired design format. Example design formats include GUI-compatible block diagrams, a design model suitable for simulation, a configuration bitstream for an FPGA, or design data for implementing an application-specific integrated circuit (ASIC).

The syntax and use of commands in the block construction language are described with reference to the remaining figures. In addition, the figures and commands illustrate how connections between block instances are rendered based on block orientations, row and column positions, and connection block instances. In the following description blocks instances may be referred to as "xblks."

The following symbols are used in the block construction language:

[ ]: Square brackets are used to denote composition of a matrix of block instances. [a] represents a 1×1 matrix having the block instance, a.

[a, b]: The comma "," within the brackets separates block instances that are to be horizontally concatenated. [a,b] represents a 1×2 matrix with block instances a and b in row 1.

[a; b]: The semi-colon ";" within the brackets separates block instances that are to be vertically concatenated. [a;b] represents a 2×1 matrix with block instances a and b in column 1.

a^n: The "^" is the power operator. When used with a block instance a, "a^n" represents raising block instance a to the power of n, which for blocks is a horizontal concatenation of n instances of block a.

n*a: The "*" is the multiplication operator. Where n is >=1 and used with a block instance a, "n*a" represents vertically concatenating n instances of block a.

i: This symbol represents the imaginary unit multiplier (square root of −1). When used in combination with the multiplication operator on a block instance, "i*a", the orientation of the block is rotated clockwise by 90 degrees.

n*a: Where n=−1, the orientation of an xblk a is rotated 180 degrees.

a': The "'" is the transposition operator. The rows and columns of xblk a are transposed.

get( ) and set( ): The get function returns parameter value(s) of the referenced xblk, and the set function sets the parameter value of the referenced xblk.

>>: The ">>" symbol denotes the Matlab console prompt. ">> dir" represents that the command "dir" is typed into the Matlab console. If the command is not terminated with a semicolon (;), the output of the command is echoed to the display 106 in the text window 122. Many of the examples that follow show the echoed output.

The following paragraphs introduce some basic commands in the block construction language. The code example below creates a primitive xblk that represents a System Generator constant block.

>> c = xblk('Constant')
XBLK type: 1 (primitive), right(1) facing
blk: xbsIndex_r3/Constant A primitive xblk is an xblk that cannot be factored into a composition of other xblks.

The orientation of the block is right facing and the block instance has a handle, "c". The "xblk( )" function is used to create a block instance. The orientation refers to the side of the block on which the output port(s) is located when viewed on a display, and the default is right facing. The "blk: xbsIndex_r3/Constant" output identifies the System Generator library element used to create the block instance.

It is also possible to set parameters in an xblk constructor. The code example below constructs a constant block having the constant value set to 0 and is up facing.

>> c = xblk('Constant','const','0', 'orientation','up')
XBLK type: 1 (primitive), up(2) facing.
blk: xbsIndex_r3/Constant Different rendering methods may be used to transform a block instance into different representations. For example, a block instance may be rendered into a Simulink model, a simulation model, or a JPEG format diagram. The examples in this document illustrate generating block diagrams by the render function. In addition to creating primitive block instances, the block construction language supports constructing composite block instances that are made of primitive or other composite block instances. FIGS. 3-6 illustrate additional concepts of the block construction language.

One convention adopted for describing various aspects of the invention is that xblks are created as objects in memory, and these objects are shown as being within a block labeled, "memory." In rendering an xblk or a composition, the composition may be displayed in a GUI window with blocks corresponding to the xblks and connections between the blocks. The GUI-displayed blocks are shown within a block labeled, "window."

Figure 3:
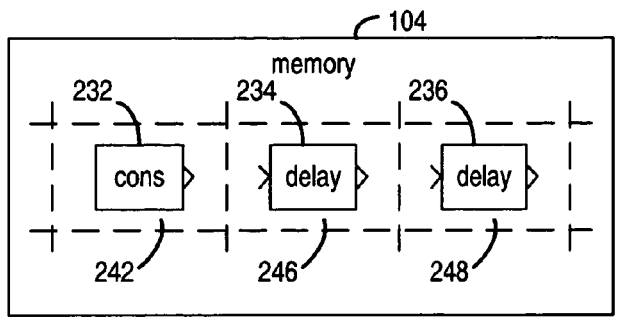
FIG. 3 illustrates an example in which a constant block and two delay blocks are composed horizontally.

FIG. 3 illustrates an example in which a constant block and two delay blocks are composed horizontally. Blocks can be composed horizontally using the matrix horizontal-concatenation operator in Matlab. Concatenation of two blocks does not imply the connection of two blocks. Horizontal concatenation indicates that the two blocks will be placed next to each other in a matrix row. When rendered, connections between ports of adjacent block instances are made. The block instances 232, 234, and 236 of FIG. 3 are generated from the following example code:

>> c = xblk('Constant');
>> d = xblk('Delay');
>> q = [c,d,d]
XBLK type: 2 (composite), right(1) facing.
blk: Rows: 1, Cols: 3
[Constant,Delay,Delay]

The constant and delay primitives are all right facing and shown as being horizontally concatenated in row 1 of the matrix in cells 242, 246, and 248. In rendering q, connections would be made from constant block 232 to delay block 234 and from delay block 234 to delay block 236.

Figure 4A:
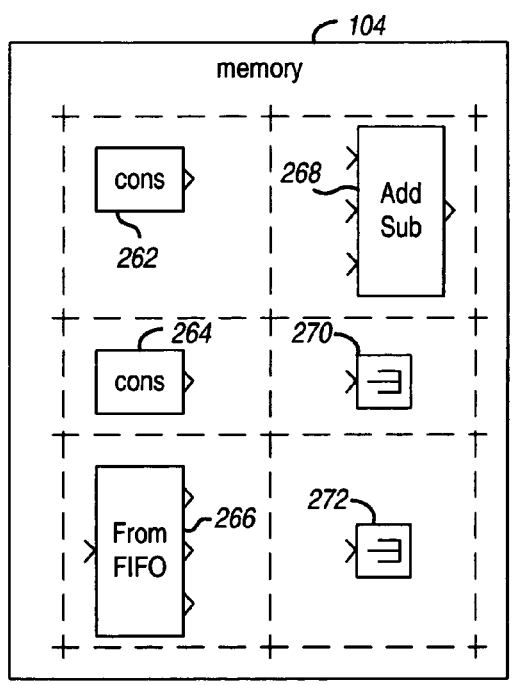
FIG. 4A illustrates an example in which the numbers of ports of adjacent block instances are not equal.
Figure 4B:
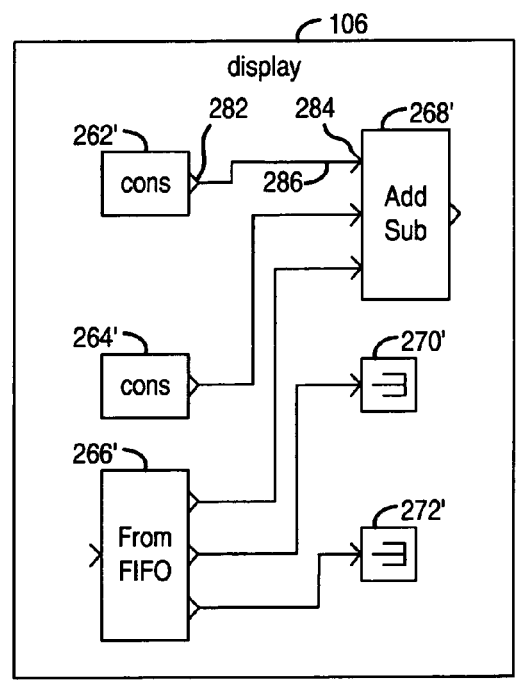
FIG. 4B illustrates the connections of the ports of the blocks.

FIG. 4A illustrates an example in which the numbers of ports of adjacent block instances are not equal, and FIG. 4B illustrates the connections of the ports of the blocks. The following example commands (up to the render command) create the composite matrix of FIG. 4A:

>> addc = xblk('AddSub','use_carryin','on')
XBLK type: 1 (primitive), right(1) facing.
blk: xbsIndex_r3/AddSub
>> c = xblk('Constant')
XBLK type: 1 (primitive), right(1) facing.
blk: xbsIndex_r3/Constant
>> fifo = xblk('From Fifo')
XBLK type: 1 (primitive), right(1) facing.
blk: xbsIndex_r3/From FIFO
>> term = xblk('simulink/Sinks/Terminator')
XBLK type: 1 (primitive), right(1) facing.
blk: simulink/Sinks/Terminator
>> render([[c;c;fifo],[addc;term;term]]);

The organization of the block instances may be specified in a render command as shown in the example code above. FIG. 4A illustrates the matrix-relative positions of the block instances 262, 264, 266, 268, 270, and 272. The "[c;c;fifo]" specifies a vertical concatenation of two constant block instances and a FIFO block instance. Likewise, the "[addc;term;term]" specifies a vertical concatenation of the addc and two terminator block instances. The two columns are horizontally concatenated.

The rendering process draws blocks by column. After drawing each column, for example blocks 262', 264', and 266' corresponding to the block instances 262, 264, and 266, the render process determines the connections to be made. For the first column there are no other columns yet drawn, so the render process proceeds to draw the next column of blocks 268', 270', and 272', which correspond to block instances 268, 270, and 272. After the second column is drawn, the rendering process determines which ports are to be connected by matching the first right-side port (282) in the first column with the first left-side port (284) in the second column, and connects ports 282 and 284. The connection is shown in display 106 as line 286. Similar processing is followed for the remaining ports. The block construction language leaves to the user the responsibility of ensuring that every source port has a matching destination port in some matrix position (not necessarily adjacent).

The following example commands illustrate that concatenation does not imply connection.

>> d = xblk('delay','orientation','up');
>> q = [d,d,d]
XBLK type: 2 (composite), right(1) facing.
blk: Rows: 1, Cols: 3
[Delay,Delay,Delay]

Figure 5:
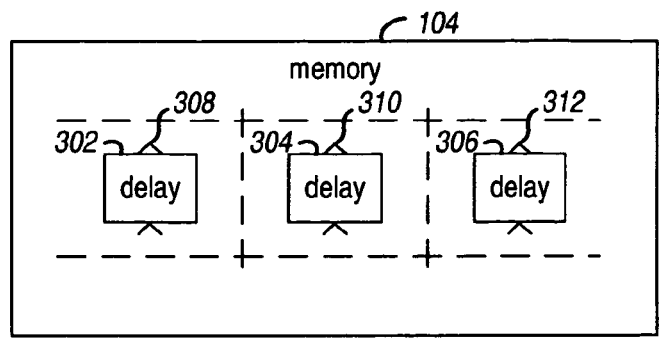
FIG. 5 shows horizontal concatenation of three delay blocks with the respective output ports facing upward.

FIG. 5 shows the resulting horizontal concatenation of 3 delay blocks 302, 304, and 306 with the respective output ports 308, 310, and 312 facing upward.

The following description provides further details on the construction of block instances using the block construction language. There are four basic types of xblks: empty, primitive, composite, and model. An xblk contains 6 basic parameters. The get and set commands can be used to access these parameters. The following command and output show the parameters.

>> get(xblk)
type [1×1 double]
name [1×4 char]
orient [1×1 double]
blk [0×0 cell]
params [0×0 cell]
filedata [0×0 double]

The type describes whether the xblk is empty (0), primitive (1), composite (2) or model (3). The notation "[1×1 double]" indicates that the parameter contains a two-dimensional array having 1 row and 1 column of a double precision value.

Name is used to identify an xlbk in constructing a subsystem if the xblk is rendered as a subsystem.

Orient indicates whether the orientation of the xblk is right (1), up (2), left (3), or down (4).

Blk is either a string handle of a primitive xblk, or a cell array of xblks. A notation of "[0×0]" indicates no value for a parameter.

Params is a cell array containing the parameters of a primitive block. The primitive constructor described below further describes Params.

Filedata is a data structure used by model-type xblks. It may contain a string linking in an "mdl" component, or binary data of a serialized and compressed mdl component. An mdl component is a component in the Simulink library as defined in an mdl file.

An empty block constructor creates an empty xblk, which is distinct from the xblk called nul. An empty xblk is an xblk that has yet to be filled with information; the nul xblk performs no computation yet occupies space in a model rendering. The nul xblk cannot be changed to perform a function. The following command illustrates creation of an empty xblk.

>> a = xblk
XBLK type: 0 (empty), Unknown facing.
blk: empty

A primitive block constructor creates a primitive xblk in response to an input text string or an input numeric handle that references a Simulink or System Generator block. If a text string is provided, the System Generator index library is searched first. If the text string is not found in the System Generator library, the block construction language library is searched next. The Simulink library is searched for the text string if the text string is not in either of the System Generator or block construction language library. The elements in the libraries have associated numeric values which may be similarly searched.

Regular expressions maybe used in constructing the name of the block. A path name may be used to disambiguate a text string between the different libraries. Names and paths of libraries cannot contain regular expressions and are case sensitive. However, names of blocks may contain regular expressions and are not case sensitive. The following commands illustrate the constructor syntax described above.

>> a = xblk('constant');
>> a = xblk('const.*');
>> a = xblk('simulink/sources/Constant');
>> a = xblk(100.00023);

A model constructor creates an xblk that is linked to a Simulink mdl file. During rendering, a subsystem is created and named after the mdl file. The model constructor is useful for adding hand-drawn models into a model created with the block construction language. The following example commands show use of a model constructor.

>> a = xblk('amodel.mdl')
XBLK type: 3 (model), right(1) facing.
mdl: amodel
>> render(a);

A hand-drawn model called, "amodel.mdl" is made into an xblk. When the xblk a is rendered, the model that is created contains a subsystem entitled "amodel." The subsystem is created by copying over all the blocks that exist in amodel.mdl.

Figure 6:
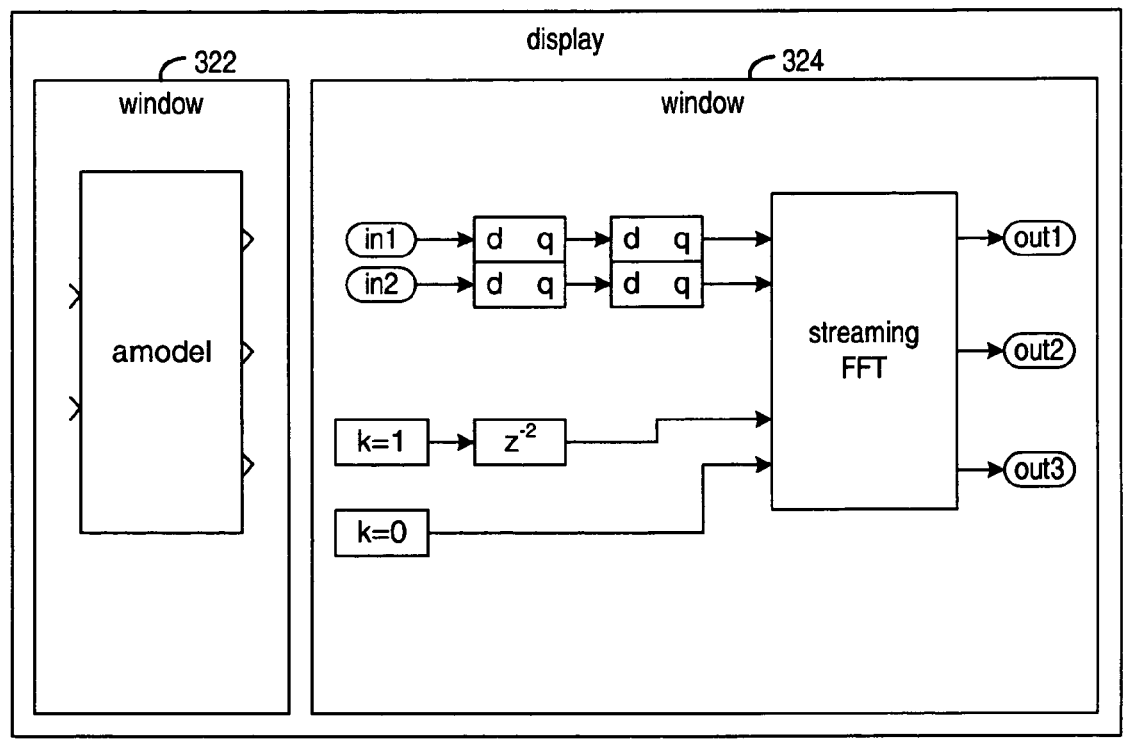
FIG. 6 shows an example in which a block instance is created from a model library.

FIG. 6 shows an example in which a block instance is created from a model library. Window 322 shows the xblk amodel that is constructed from the command, "a =xblk('amodel.mdl')". Window 324 shows the objects that are generated for display in rendering the amodel xblk.

Figure 7:
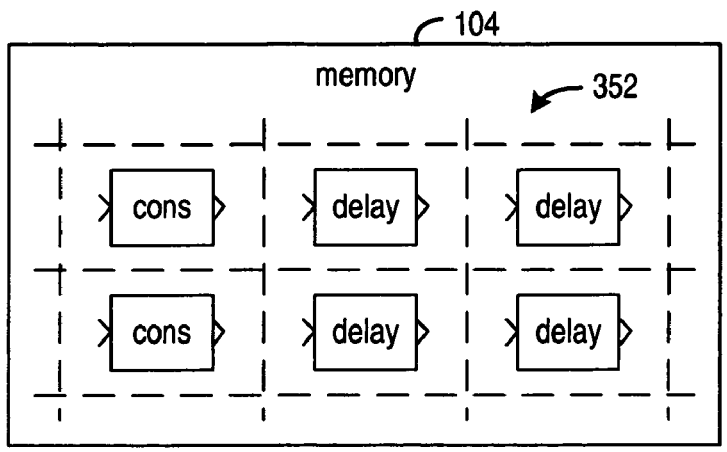
FIG. 7 illustrates an example arrangement of design blocks that has been formed using concatenation operators.

FIG. 7 illustrates an example arrangement of design blocks that has been formed using concatenation operators. The block construction language allows a user to construct a matrix using numerous approaches, two of which are illustrated in the example commands below:

>> c = xblk('Constant');
>> d = xblk('delay');
>> q = [c,d,d;c,d,d];
>> r = [[c;c],[d;d],[d;d]];

The matrix may be constructed as a vertical concatenation of rows (variable q) or a horizontal concatenation of columns (variable r).

Figure 8:
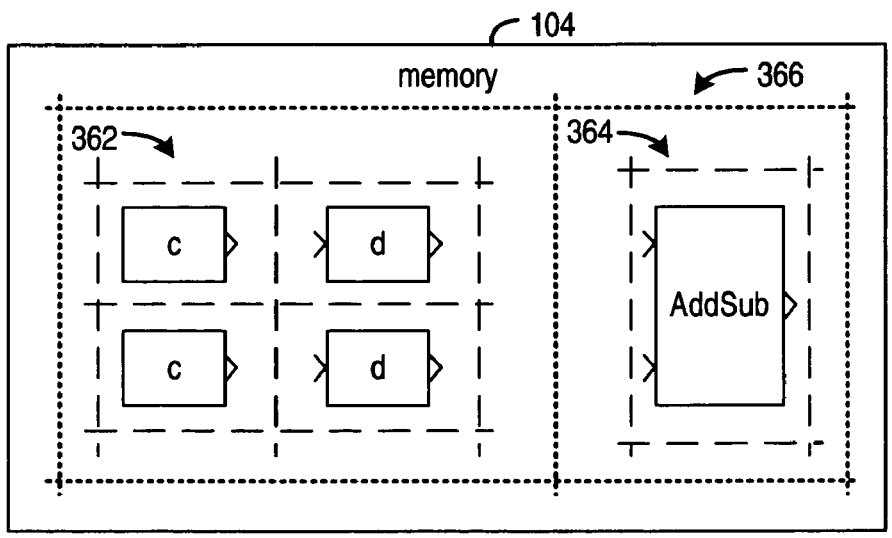
FIG. 8 is a block diagram that illustrates an example in which xblks have different dimensions in the dimension of concatenation.

FIG. 8 is a block diagram that illustrates an example in which xblks have different dimensions in the dimension of concatenation. That is, the xblks being horizontally concatenated have different numbers of rows. When xblks of different dimensions are concatenated, xblks are made into subsystems before concatenation. During rendering, these xblks are rendered as subsystems. The commands below illustrate concatenating xblks of different dimensions:

>> q=[c,d;c,d]
XBLK type: 2 (composite), right(1) facing.
blk: Rows: 2, Cols: 2
[Constant,Delay;
Constant,Delay]
>> a = [q,xblk('AddSub')]
XBLK type: 2 (composite), right(1) facing.
blk: Rows: 1, Cols: 2
[xblk,AddSub]

In the above example, the xblk a is composed by horizontally concatenating a [2×2] xblk 362 with a [1×1] xblk 364. The xblk 366 that is returned has dimensions of [1×2]. Because xblk q is considered as a subsystem when being concatenated with "xblk('AddSub')", the subsystem is viewed as being [1,1], and the concatenation results in a [1,2] xblk 366. If a flattened design (design without hierarchical relationships) is required, it is up to the user to make sure that the dimensions of xblks match before concatenation as illustrated by the following commands:

>> include 'prelude';
>> flattened_a =[q[xblk('AddSub');nul]]
XBLK type: 2 (composite), right(1) facing.
blk: Rows: 2, Cols: 3
[Constant, Delay,AddSub;
Constant,Delay,null]

The nul block is used as a pad in the xblk flattened_a in order to produce a flattened design and is removed at render time. The resulting matrix (not shown) has dimensions [2×3]. When xlbk a is rendered, there will be two blocks at the top level of the diagram: a subsystem called xblk and a block called AddSub. A user may select (e.g., double-click) on the subsystem and view the contents of the subsystem (i.e., the constant and delay blocks). When the xblk flattened_a is rendered, there will be 5 blocks on the top level: the constant blocks, delay blocks and the AddSub block, and there will not be a subsystem block in the rendered design.

The "include 'prelude'" command loads into scope several predefined xblks, such as the nul xblk. The nul xblk is named "nul" and not "null" in order to avoid confusion with the Matlab function null.

Figure 9A:
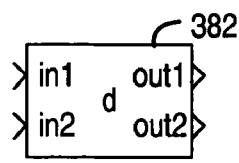
FIGS. 9A-9E show different orientations of an xblk that is rotated according to the operators in a set of commands.

FIGS. 9A-9E show different orientations of an xblk that is rotated according to the operators in commands applied to the xblk of FIG. 9A. The orientation of a block is described by the orientation parameter of a block, which may be set using the set command. Alternatively, the multiplication operation is overloaded so that an xblk may be rotated by applying the multiplication operator to the xblk. In an example embodiment, multiplication by a negative number is interpreted as a 180 degrees counterclockwise rotation, and multiplication by an imaginary number is interpreted as a 90 degree counterclockwise rotation. Due to the way Simulink draws blocks, a multiply by −1 is really a rotation and a flip (top ports will always remain on top).

The following command illustrates creation of the xblk d as shown in FIG. 9A:

>> d=xblk('delay')
XBLK type: 1 (primitive), right(1) facing.
blk: xbsIndex_r3/Delay The initial orientation of xblk 382 is right facing. The following command multiplies the xblk d of FIG. 9A by −1:

>> d*−1
XBLK type: 1 (primitive), left(3) facing.
blk: xbsIndex_r3/Delay

Figure 9B:
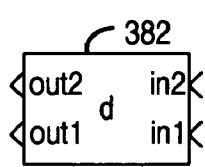

Multiplication of xblk d by −1 causes the xblk 382 to be rotated by 180 degrees as shown in FIG. 9B.

The minus operator preceding an xblk is also a multiplication by −1 as shown by the following command:

>> −d
XBLK type: 1 (primitive), left(3) facing.
blk: xbsIndex_r3/Delay

Figure 9C:
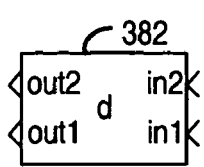

Thus, "−d" applied to the xblk d of FIG. 9A results in the orientation of xblk 382 shown in FIG. 9C, which is the same as the orientation in FIG. 9B.

The following command multiplies xblk d of FIG. 9A by the imaginary number, i:

>> d*i
XBLK type: 1 (primitive), up(2) facing.
blk: xbsIndex_r3/Delay

Figure 9D:
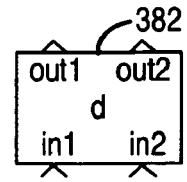

Multiplication by i results in rotation of the xblk d by 90 degrees counterclockwise (relative to the orientation of the xblk d in FIG. 9A) as shown in FIG. 9D.

The following command multiplies xblk d of FIG. 9A by −i.

>> d*−i
XBLK type: 1 (primitive), down(4) facing.
blk: xbsIndex_r3/Delay

Figure 9E:
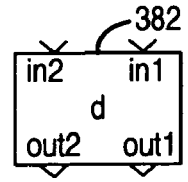

The resulting orientation is shown in FIG. 9E. Negation of the imaginary operator i results in a total rotation of 270 degrees counterclockwise.

Figure 10:
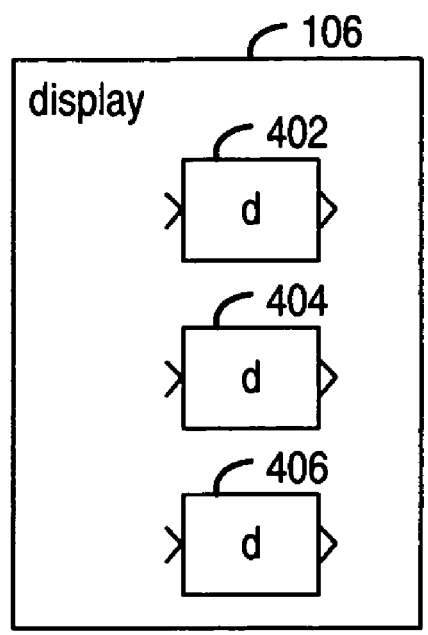
FIG. 10 shows the replication and rotation of a composite xblk in response to an example command.

FIG. 10 shows the replication and rotation of a composite xblk in response to an example command. A rotated primitive xblk is drawn with the specified rotation. However, a rotated composite block is rotated only if the composite block is drawn as a subsystem. The following example command illustrates rotation of a composite xblk w.

>> w = d*3i
XBLK type: 2 (composite), up(2) facing.
blk: Rows: 3, Cols: 1
[Delay;
Delay;
Delay]
>> render(w);

The first command above (which is interpreted as w=d*3*i) causes three xblks d to be created in a column. Since the default orientation is right, the multiplication by i rotates the orientation of the xblk w counterclockwise by 90 degrees. This results in an up-facing xblk w as shown in the output above. Note, however, that the xblks d within the xblk w remain right facing as shown by blocks 402, 404, and 406.

Figure 11:
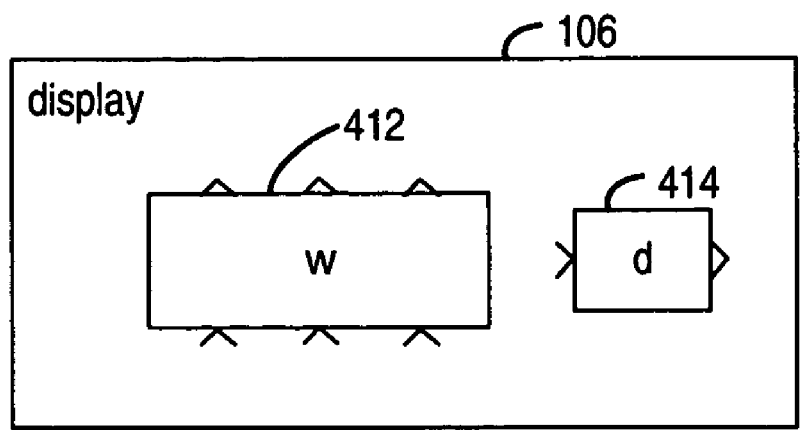

The rendering of xblk w is shown in FIG. 11. Although the xblk w 412 is up-facing, rendering causes it to be right facing when it is the top level. According to an example embodiment, if a composite xblk is drawn as a top level model, rotation is applied only to the child subsystems of the composite block.

FIG. 11 shows the orientation of blocks within an xblk when xblk w is rendered as a subsystem of xblk a. The following commands produce blocks 412 and 414 of FIG. 11:

>> w = d*3i
XBLK type: 2 (composite), up(2) facing.
blk: Rows: 3, Cols: 1
[Delay;
Delay;
Delay]
>> a =[w,d]
XBLK type: 2 (composite), right(1) facing.
blk: Rows: 1, Cols: 2
[xblk,Delay]
>>render(a);

In the above example, the xblk w 412 is now rendered as a subsystem of the xblk a. It is thus rendered with up-facing orientation. The rendering of a subsystem does not effect how the blocks in that subsystem are rendered. In FIG. 11, xblk w is rendered as upfacing but the blocks inside are right facing as shown in FIG. 10.

The following example set of commands illustrates use of the transposition operator, ', on xblks:

>> rotated = (d^3)*i
XBLK type: 2 (composite), up(2) facing.
blk: Rows: 1, Cols: 3
[Delay,Delay,Delay]
>> transposed = (d^3)'
XBLK type: 2 (composite), right(1) facing.
blk: Rows: 3, Cols: 1
[Delay;
Delay;
Delay]
>> transposed2 = [d^3;c^3]'
XBLK type: 2 (composite), right(1) facing.
blk: Rows: 3, Cols: 2
[Delay,Constant;
Delay,Constant;
Delay,Constant]

Figure 12A:
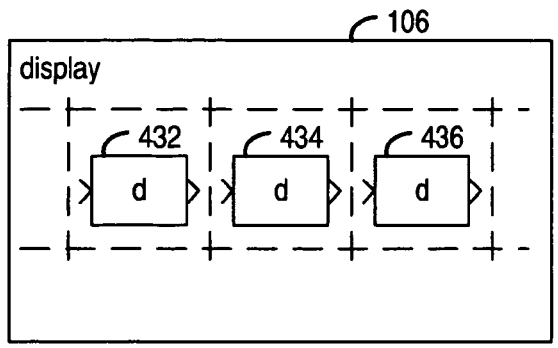
FIG. 12A shows three replicated blocks resulting from the first command.
Figure 12B:
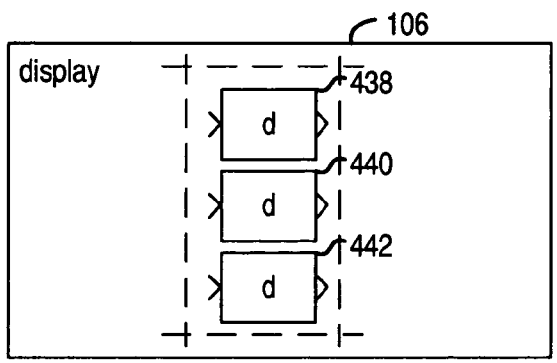
FIG. 12B shows a transposition of three replicated blocks resulting from a second command.
Figure 12C:
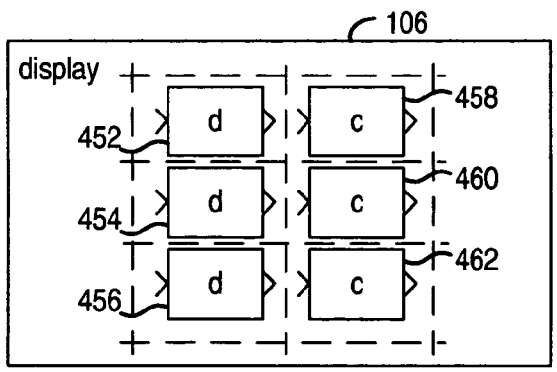
FIG. 12C shows a transposition of two rows of three replicated blocks resulting from a third command.

FIG. 12A shows three replicated blocks resulting from the first command; FIG. 12B shows a transposition of three replicated blocks resulting from the second command; and FIG. 12C shows a transposition of two rows of three replicated blocks resulting from the third command.

The first command, "rotated = (d^3)*i", creates three delay xblks 432, 434, and 436 in a row. Multiplication by i causes the delay blocks to be designated as up facing. However, since the xblk named "rotated" is not a subsystem, the delays remain right facing.

The second command, "transposed = (d^3)'", creates three delay blocks in a row. The ' operator causes a transposition of those blocks from a row to a column of blocks 438, 440, and 442 as shown in FIG. 12B. Blocks 438, 440, and 442 are right facing by default.

The third command, "transposed2=[d^3;c^3]'", involves a transposition of two rows. The first row (not shown) is created with 3 d primitives, and the second row (not shown) is created with 3 c primitives. FIG. 12C shows the transposition of these two rows. The d primitives in the first row become the primitives 452, 454, and 456 in the first column, and the c primitives in the second row become the primitives 458, 460, and 462 in the second column.

The Get and Set commands may be used to read and write the parameters of an xblk. Type describes the type of an xblk: empty (0), primitive (1), composite (2) or model (3). Name is the name used to construct a subsystem, if the xblk is rendered as a subsystem. Orient is the orientation of the xblk: 'right' or 1, 'up' or 2, 'left' or 3, 'down' or 4. Blk is either a string handle of a primitive block, or a cell array of xblks. Params is a cell array containing the parameters of a primitive block (see primitive constructor). Filedata is a data structure used by model xblks. The Filedata may contain a string linking in a mdl, or binary data of a serialized and compressed mdl.

Figure 13:
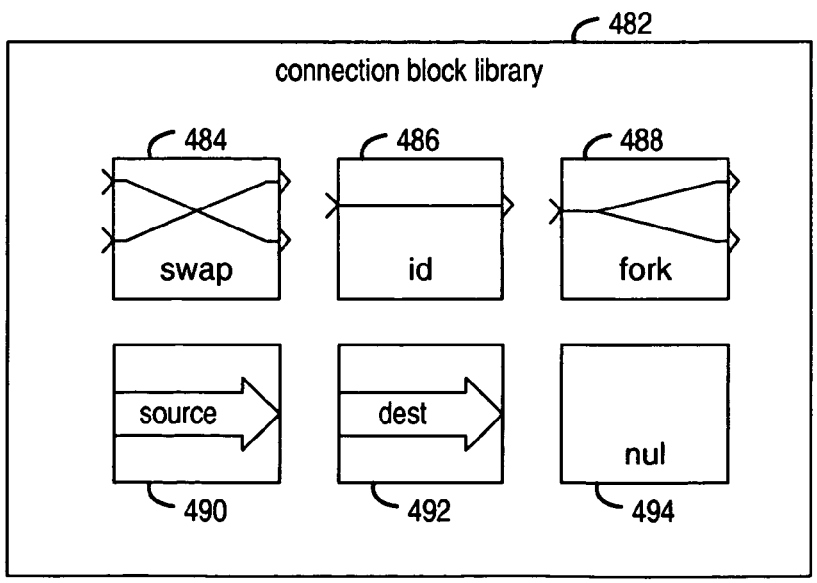
FIG. 13 shows example components in a connection block library.

If the xblk is a primitive xblk, it is also possible to set the parameters of the block that will be drawn during rendering. For example, for a constant block the value of the constant may be established with the set command. The example commands below show setting the constant value.

c=xblk('Constant');
set(c,'const','0');

A block library and helper functions are associated with the block construction language in one embodiment. FIG. 13 shows example components in a connection block library 482. The blocks in the connection library may be used in helping the user to make block connections. Each of the connection blocks may be named in a command as occupying a matrix position as would the constant and delay primitives used in the previous examples.

The swap block 484 may be used to cross the signal connections between adjacent ports. For example, if a first block as two output ports, a second block has two input ports, and the first and second output ports of the first block are in a matrix position for connection to the first and second input ports of the second block, respectively, the swap block may be used to instead connect the first output port to the second input port and the second output port to the first input port. Thus, the swap block 484 has two input ports and two output ports, with the first input port connected to the second output port, which is not aligned with the first input port, and the second input port connected to the first output port, which is not aligned with the second input port.

The id block 486 is a wire for connecting an output port to an input port across a row or a column.

The fork block 488 may be used to fork an input signal to two output ports.

The source and destination blocks 490 and 492 are used to implement feedback loops. Use of the source and destination blocks is described in the explanation of FIGS. 14A and 14B.

The nul block is used as a place filler and performs no function. Nul blocks are removed during rendering.

The declaration, "include 'prelude'" maybe used to load the connection block library into a user's scope. After the declaration, the swap, id, fork, and nul blocks have been loaded into variables called swap, id, fork and nul. Additionally, the functions src and dst are available for making source and destination blocks to be used to establish a feedback loop.

Certain Simulink basic blocks have also been predefined and can be included with the following declaration:

include 'simulink_basic';

This allows the Simulink blocks to be used in the block construction language. Table 1 below shows the xblk names and the corresponding Simulink block and path names provided with the preceding declaration.

TABLE 1

| xblk | Simulink block |
|------|----------------|
| disp | simulink/Sinks/Display |
| display | simulink/Sinks/Display |
| inport | simulink/Sources/In1 |
| outport | simulink/Sinks/Out1 |
| scope | simulink/Sinks/Scope |
| term | simulink/Sinks/Terminator |
| terminator | simulink/Sinks/Terminator |

Figure 14A:
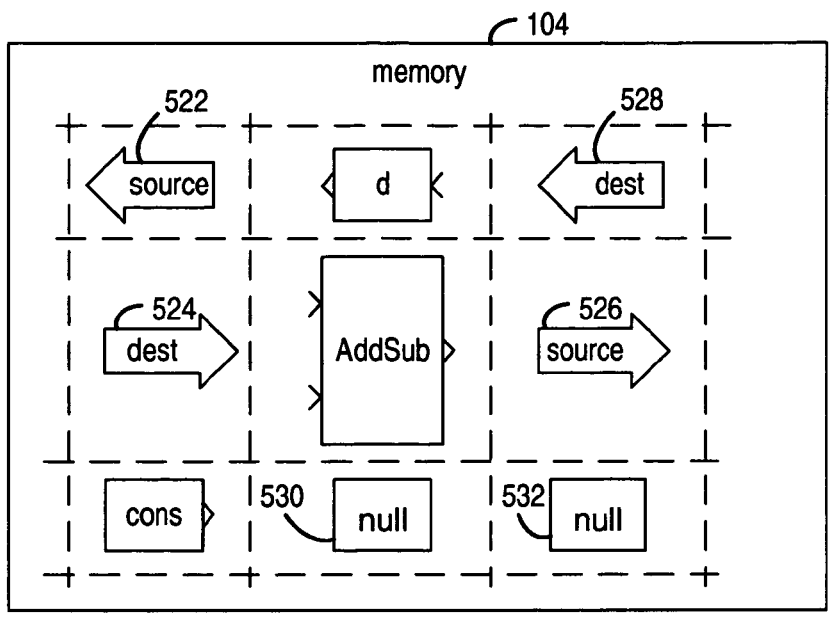
FIG. 14A shows example xblks generated from commands for creating a design having a feedback loop.

In one embodiment, feedback loops may be implemented using the source and destination blocks from the connection library 482. Source and destination blocks must be created in the same subsystem in order to be automatically connected during rendering. The src and dst functions that are available by way of the included prelude allow labels to be associated with source and dest blocks. Rendering causes a dest block and a source block having same labels to be connected. The following commands illustrate use of source and dest blocks for implementing a feedback loop.

function a=myDesign
include 'prelude';
d = xblk('Delay');
c = xblk('Constant');
add = xblk('AddSub');
col1=[-src('delayinv');dst('delayinv');c];
col2=[-d;add;nul];
col3=[-dst('add');src('add');nul];
a =[col1,col2,col3];

FIG. 14A shows example xblks generated from the commands above for creating a design having a feedback loop.

In the first column it may be seen that source and dest blocks 522 and 524 are adjacent. The command, "col1=[-src('delayinv');dst('delayinv');c];" gave both the source block 522 and the dest block 524 the same label, and the orientation of the source block is rotated by 180 degrees. The command that sets col3 similarly creates source and dest blocks 526 and 528. The nul blocks are created to keep the dimensions of col2 and col3 the same as col1 in order to prevent col1 from being implemented as a subsystem.

Figure 14B:
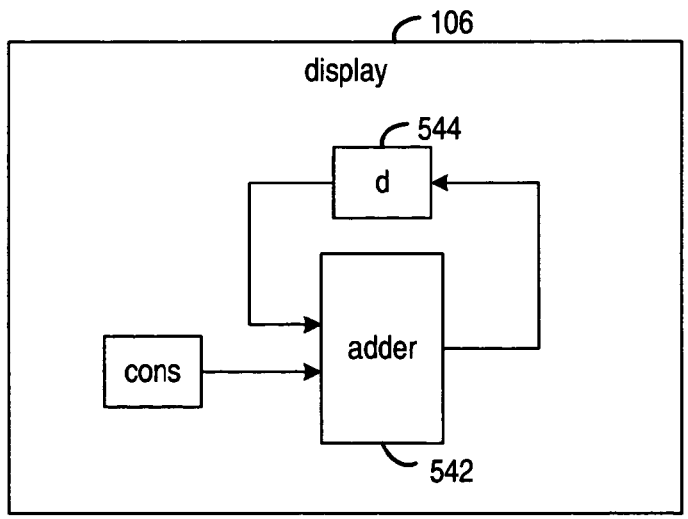
FIG. 14B shows the design blocks resulting from rendering of the xlbk objects of FIG. 14A.

FIG. 14B shows the design blocks resulting from rendering of the xblk objects of FIG. 14A. Source block 522, dest block 524, source block 526, and dest block 528 disappear from the rendered design. But the presence in the matrix allows the output port of adder 542 to be connected to the input port of delay block 544, and the output port of delay block 544 to be connected to an input port adder 542. The design may be rendered with the command:

>> render(myDesign);

The implicit connectivity between blocks as provided in the block construction language reduces the burden on designers. However, there may be instances where more complex connectivity is required. Such connectivity patterns can be captured in templates written in the block construction language.

Figure 15:
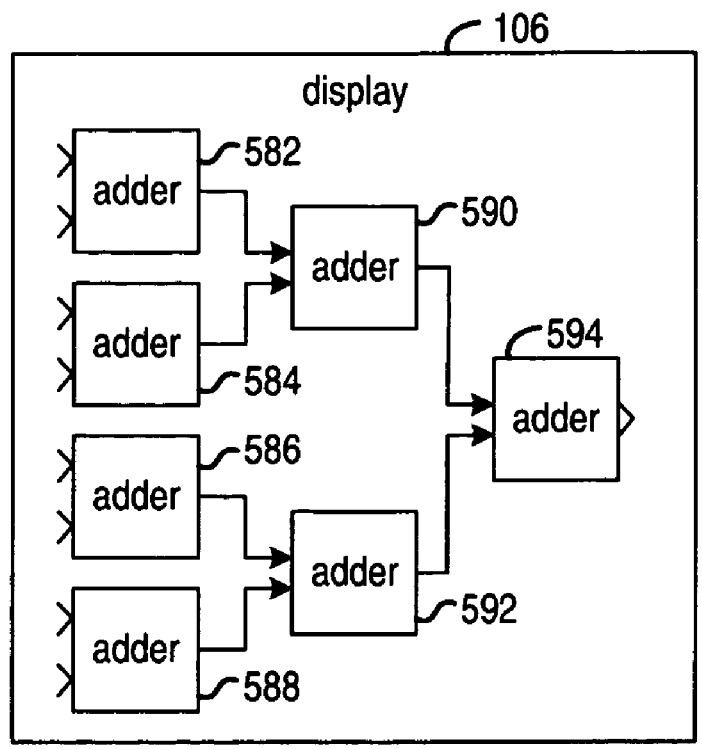
FIG. 15 illustrates the output of a function that creates a binary tree of design blocks from an input xblk.

FIG. 15 illustrates the output of a function that creates a binary tree of design blocks from an input xblk. The following function implements a template for a binary tree connection pattern:

```
function outblk = btree(blk,level,flatten)
% BTREE creates a binary tree from the block blk.
% blk is expected to have 2 inputs and 1 output
% level is the number of levels in the tree
% flatten when set to 1, creates a flattened tree, otherwise,
    each
% level of a tree will be in a subsystem.
if (nargin <3)
    flatten=1;
end
outblk=[ ];
if flatten
    startlevel=level-1;
    outblk=(blk^(2^startlevel))';
    nb=xblk('null');
    for loop=level-2:-1:0
        fac= 2^loop;
        nbfac= (2^(startlevel-loop))-1;
        top = nbfac - round(nbfac/2);
        bot = nbfac - top;
        if (top~=0) t = nb ^top; else t =[ ]; end
        if (bot~=0) b = nb ^bot; else b =[ ]; end
        outblk=[outblk,([t,blk,b]^fac)'];
    end
else
    for loop=(level-1):-1:0
        fac =2^loop;
        outblk=[outblk,(blk^fac)'];
    end
end
```

The example binary tree connection pattern of FIG. 15 assumes that the input xblk is an adder, the number of levels is 3, and the design is not flattened. Adders 582, 584, 586, and 588 are in level 1 of the adder tree, adders 590 and 592 are in level 2 of the adder tree, and adder 594 is in level 3 of the adder tree.

The If clause illustrates the code that implements a flattened connection tree, and the else clause illustrates the code that implements a non-flattened connection tree. Nul blocks are added in the relevant places to prevent columns from collapsing into subsystems as shown by the commands and output below.

```
>> add =xblk('AddSub')
XBLK type: 1 (primitive), right(1) facing.
blk: xbsIndex_r3/AddSub
>> a=btree(add,3)
XBLK type: 2 (composite), right(1) facing.
blk: Rows: 4, Cols: 3
[AddSub,AddSub,null;
AddSub,null,AddSub;
AddSub,AddSub,null;
AddSub,null,null]
>> render(a)
```

Another common wiring pattern is to interleave signals. The following function returns a connection pattern that forks each input and interleaves the signals.

```
function o = interleave(numnodes)
include 'prelude';
o = [numnodes*fork;nul];
o = [o,[id;(numnodes-1)*swap;id]];
```

The function may be entered as a command with the resulting output as shown below:

```
>> interleave(3)
XBLK type: 2 (composite), right(1) facing.
blk: Rows: 4, Cols: 2
[fork,id;
fork,swap;
fork,swap;
null,id]
```

A specific example use of the interleave function in connecting xblks is illustrated as follows:

```
>> a = [[c*3;nul*3][interleave(3);(nul*2)^2][term*6]]
XBLK type: 2 (composite), right(1) facing.
blk: Rows: 6, Cols: 4
[Constant,fork,id,Terminator;
Constant,fork,swap,Terminator;
Constant,fork,swap,Terminator;
null,null,id,Terminator;
null,null,null,Terminator;
null,null,null,Terminator]
>> render(a,1);
```

Figure 16:
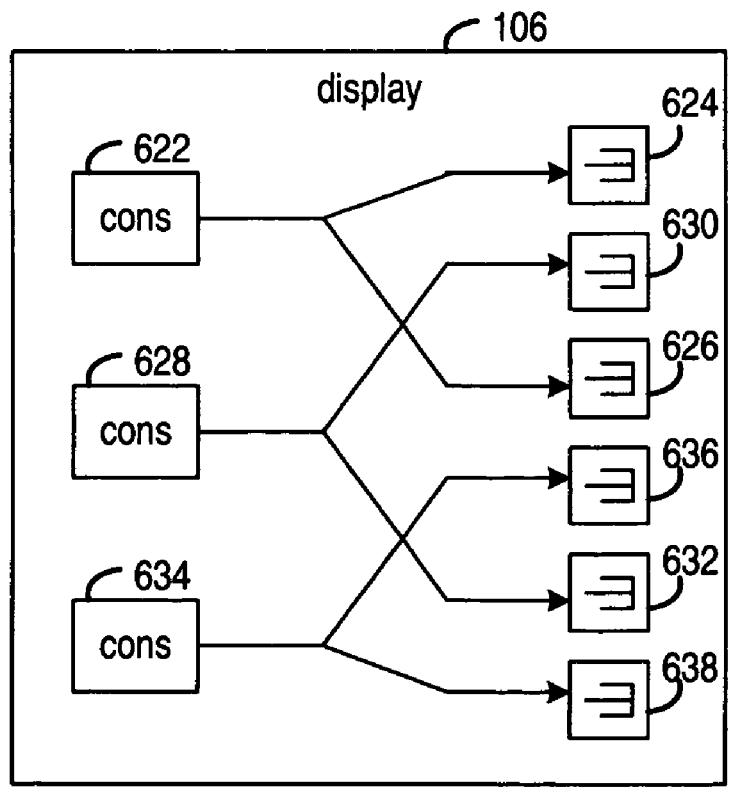
FIG. 16 illustrates the rendered output from example code that invokes an interleave function.

FIG. 16 illustrates the rendered output from the example code above. The output port of constant 622 is connected to terminals 624 and 626; the output port of constant 628 is connected to terminals 630 and 632; and the output port of constant 634 is connected to terminals 636 and 638.

Figure 17:
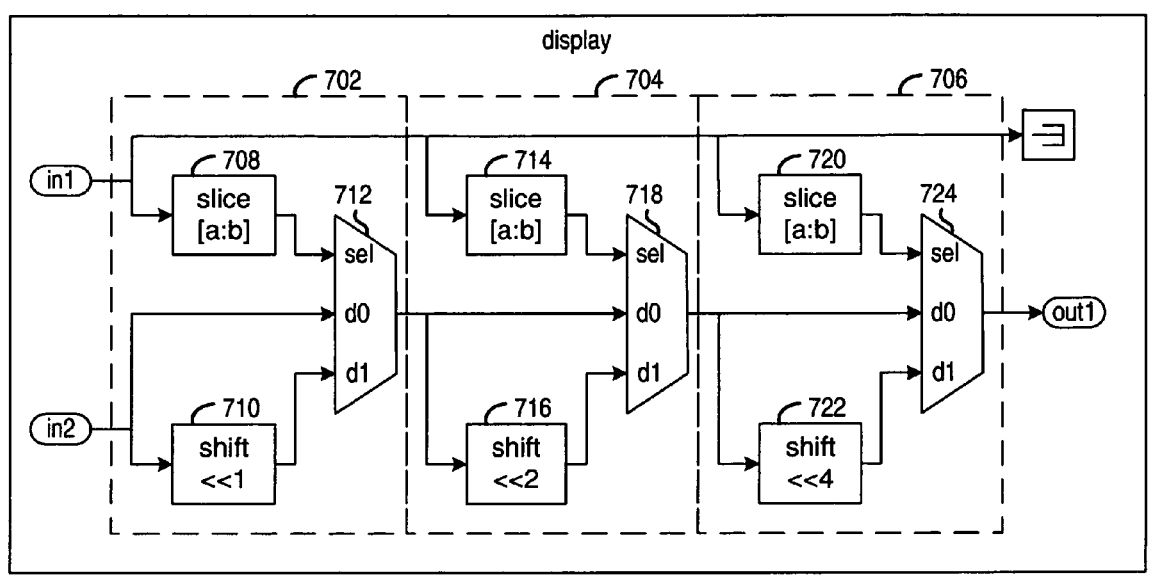
FIG. 17 illustrates an example in which a 3-bit barrel shifter design is created using various embodiments of the invention.

FIG. 17 illustrates an example in which a 3-bit barrel shifter design is created using various embodiments of the invention. The code below shows the block construction language code that implements an n-bit barrel shifter. The barrelShifter function may be used to create xblks for an n-bit barrel shifter. The shifterSlice function is called by the barrelShifter function to create a one-bit slice of the barrelShifter. The slices are illustrated as dashed blocks 702, 704, and 706. Slice 702 includes slice block 708, shift block 710, and multiplexer 712; slice 704 includes slice block 714, shift block 716, and multiplexer 718; and slice 706 includes slice block 720, shift block 722, and multiplexer 724.

```
function b=barrelShifter(nbits)
% Shiftport is the number of shifts to perform
% valport is the number you wish to shift
include 'simulink_basic';
include 'prelude';
valport = inport;
set(valport,'Name','Val');
shiftport = inport;
set(shiftport,'Name', 'Shiftnum');
b=[shiftport;nul;valport;nul];
for loop = 0:(nbits-1)
    b=[b, shifterSlice(loop)];
end
b=[b, [term;outport;nul;nul]];
% ---------------------------------------------
function ss = shifterSlice(bitnum)
include 'prelude';
% Bitnum starts from zero (0)
shiftby = 2^bitnum;
slice=xblk('slice', ...
    'mode','Lower Bit location + Width', ...
    'nbits','1', ...
    'bit0',num2str(bitnum), ...
    'base1','MSB of Input');
shift=xblk('shift', ...
    'shift_dir','Left', ...
    'shift_bits',num2str(shiftby), ...
    'precision','Full');
mux = xblk('Mux');
col1 = [fork;fork;nul;nul];
col2 = [id;slice;id;shift];
col3 = [id;mux;nul;nul];
ss=[col1,col2,col3];
```

Those skilled in the art will appreciate that various alternative computing arrangements, including one or more processors and a memory arrangement configured with program code, would be suitable for hosting the processes and data structures of the different embodiments of the present invention. In addition, the processes may be provided via a variety of computer-readable media or delivery channels such as magnetic or optical disks or tapes, electronic storage devices, or as application services over a network.

The present invention is thought to be applicable to a variety of systems for preparing and generating a circuit design. Other aspects and embodiments of the present invention will be apparent to those skilled in the art from consideration of the specification and practice of the invention disclosed herein. It is intended that the specification and illustrated embodiments be considered as examples only, with a true scope and spirit of the invention being indicated by the following claims.

What is claimed is:

1. A processor-implemented method for generating a circuit design, comprising:
   generating, by using a processor, in a memory arrangement respective instances of design blocks in response to user-entered commands that specify creation of the instances;
   establishing in the memory arrangement matrix-relative positions of the instances of design blocks in response to at least one user-entered command that specifies respective matrix positions of the instances; and
   generating in the memory arrangement representative connections between the instances in response to a user-entered command having no specification of the connections,
   wherein each instance of a design block has each input port assigned to a first side and each output port assigned to a second side of the instance of the design block, and wherein the step of generating representative connections includes:
      for each pair of adjacent rows, establishing representative connections between output ports of instances in a first row of the pair and input ports of a second row of the pair in an order in which the output ports and input ports occupy matrix positions from one end of the pair of rows to an opposite end of the pair of rows, and for each pair of adjacent columns, establishing representative connections between output ports of instances in a first column of the pair and input ports of a second column of the pair in an order in which the output ports and input ports occupy matrix positions, from one end of the pair of columns to an opposite end of the pair of columns;
      wherein, in response to a number of output ports of a first design block instance in a first row and a first column, being not equal to a number of input ports of a second design block instance in the first row and a second column that is adjacent to the first column, establishing a representative connection between at least one output port of the first design block instance and an input port of a third design block instance in a row other than the first row and in the second column;
      wherein the commands that specify matrix-relative positions include a first matrix operator that rotates each input port and output port to a different side of an instance of a specified instance of a design block.

2. The method of claim 1, wherein the instances, positions, and connections are in a first design format, and further comprising generating in the memory arrangement in response to user-input, a representation of the instances of design blocks and connections in a second design format that is different from the first design format.

3. The method of claim 2, wherein the second format is one of a format for display of the design, a hardware description language format, a design model for simulation, and a configuration bitstream for an FPGA.

4. The method of claim 1, wherein the matrix-relative positions of the instances are for a first-level matrix, and an instance at a first position in the first-level matrix includes at least two instances of design blocks in a second-level matrix nested at the first position in the first-level matrix.

5. The method of claim 1, wherein the commands that specify matrix-relative positions include a first matrix operator for concatenating at least two instances into a row of the matrix.

6. The method of claim 5, wherein the commands that specify matrix-relative positions include a second matrix operator for concatenating at least two instances into a column of the matrix.

7. The method of claim 6, wherein the commands that specify matrix-relative positions include a third matrix operator that replicates a specified design block into a specified number of instances in a row of the matrix.

8. The method of claim 7, wherein the commands that specify matrix-relative positions include a fourth matrix operator that replicates a specified design block into a specified number of instances in a column of the matrix.

9. The method of claim 1, wherein the commands that specify matrix-relative positions include a first matrix operator that replicates a specified design block into a specified number of instances in a row of the matrix and a second matrix operator that replicates a specified design block into a specified number of instances in a column of the matrix.

10. The method of claim 1, wherein the first matrix operator rotates each input port and output port to an opposite side of the instance of the specified instance of a design block.

11. The method of claim 10, wherein the commands that specify matrix-relative positions include a second matrix operator that rotates each input port and output port to an adjacent side of an instance of a specified instance of a design block.

12. The method of claim 1, wherein the commands that specify matrix-relative positions include a second matrix operator that transposes matrix positions of instances of the design blocks.

13. The method of claim 1, wherein the design blocks include a first connection block having first and second input ports and first and second output ports, wherein the first and second input ports are assigned to a first side of the first connection block, the first and second output ports are assigned to a second side of the first connection block that is opposite the first side, the first input port is aligned with the first output port, the second input port is aligned with the second output port, the first input port is connected to the second output port, and the second input port is connected to the first output port.

14. The method of claim 1, wherein the design blocks include a first connection block having an input port assigned to a first side of the design block and an output port assigned to a second side of the design block that is opposite the first side, and the input port is connected to the output port.

15. The method of claim 1, wherein the design blocks include a first connection block having an input port assigned to a first side of the design block and first and second output ports assigned to a second side of the design block opposite the first side, and the input port is connected to the first and second output ports.

16. The method of claim 1, wherein the design blocks include a source connection block and a destination connection block, instances of source and destination connection blocks have respective names, and the step of generating representative connections includes establishing a representative connection from each source connection block to each destination connection block having, names that are equal.

17. The method of claim 1, wherein the first matrix operator that rotates each input port and output port to a different side of an instance of a specified instance of a design block, rotates each input port and output port in the same direction and by the same amount.

18. An apparatus for generating a circuit design, comprising:
   means for generating in a memory arrangement respective instances of design blocks responsive to user-entered commands that specify creation of the instances;
   means for establishing in the memory arrangement matrix-relative positions of the instances of design blocks responsive to at least one user-entered command that specifies respective matrix positions of the instances; and
   means for generating in the memory arrangement representative connections between the instances responsive to a user-entered command having no specification of the connections,
   wherein each instance of a design block has each input port assigned to a first side and each output port assigned to a second side of the instance of the design block, and wherein the means for generating representative connections includes:
      means, for each pair of adjacent rows, for establishing representative connections between output ports of instances in a first row of the pair and input ports of a second row of the pair in an order in which the output ports and input ports occupy matrix positions from one end of the pair of rows to an opposite end of the pair of rows, and for each pair of adjacent columns, establishing representative connections between output ports of instances in a first column of the pair and input ports of a second column of the pair in an order in which the output ports and input ports occupy matrix positions, from one end of the pair of columns to an opposite end of the pair of columns;
   wherein the means for establishing, responsive to a number of output ports of a first design block instance in a first row and a first column, being not equal to a number of input ports of a second design block instance in the first row and a second column that is adjacent to the first column, establishes a representative connection between at least one output port of the first design block instance and an input port of a third design block instance in a row other than the first row and in the second column;
   wherein the commands that specify matrix-relative positions include a first matrix operator that rotates each input port and output port to a different side of an instance of a specified instance of a design block.

19. A system for generating a circuit design, comprising:
   a computing arrangement;
   a memory arrangement coupled to the computing arrangement; and
   a command processor hosted by the computing arrangement, wherein the command processor is configured to receive user input commands and in response to the commands,
      generate in the memory arrangement respective instances of design blocks for commands that specify creation of the instances;
      establish in the memory arrangement matrix-relative positions of the instances of design blocks for commands that specify respective matrix positions of the instances; and
      generate in the memory arrangement representative connections between the instances for a command having no specification of the connections,
   wherein each instance of a design block has each input port assigned to a first side and each output port assigned to a second side of the instance of the design block, and wherein the generating of representative connections includes:
      for each pair of adjacent rows, the command processor is configured to establish representative connections between output ports of instances in a first row of the pair and input ports of a second row of the pair in an order in which the output ports and input ports occupy matrix positions from one end of the pair of rows to an opposite end of the pair of rows, and for each pair of adjacent columns, establish representative connections between output ports of instances in a first column of the pair and input ports of a second column of the pair in an order in which the output ports and input ports occupy matrix positions, from one end of the pair of columns to an opposite end of the pair of columns;
   wherein the command processor, responsive to a number of output ports of a first design block instance in a first row and a first column, being not equal to a number of input ports of a second design block instance in the first row and a second column that is adjacent to the first column, establishes a representative connection between at least one output port of the first design block instance and an input port of a third design block instance in a row other than the first row and in the second column;
   wherein the commands that specify matrix-relative positions include a first matrix operator that rotates each input port and output port to a different side of an instance of a specified instance of a design block.

* * * * *